(12) United States Patent
Araki

(10) Patent No.: US 11,621,709 B2
(45) Date of Patent: Apr. 4, 2023

(54) POWER MODULE WITH BUILT-IN DRIVE CIRCUITS

(71) Applicant: FUJI ELECTRIC CO., LTD., Kawasaki (JP)

(72) Inventor: Ryu Araki, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/211,563

(22) Filed: Mar. 24, 2021

(65) Prior Publication Data

US 2021/0359676 A1 Nov. 18, 2021

(30) Foreign Application Priority Data

May 13, 2020 (JP) .............................. JP2020-084784

(51) Int. Cl.
| | |
|---|---|
| *H03K 17/284* | (2006.01) |
| *H02M 7/5387* | (2007.01) |
| *H02M 1/38* | (2007.01) |
| *H03K 5/1534* | (2006.01) |
| *H02P 27/06* | (2006.01) |
| *H03K 5/24* | (2006.01) |
| *G01R 19/165* | (2006.01) |
| *H02P 6/28* | (2016.01) |
| *H03K 5/00* | (2006.01) |
| *H02M 1/00* | (2006.01) |

(52) U.S. Cl.
CPC ..... *H03K 17/284* (2013.01); *G01R 19/16538* (2013.01); *H02M 1/38* (2013.01); *H02M 7/53871* (2013.01); *H02P 6/28* (2016.02); *H02P 27/06* (2013.01); *H03K 5/1534* (2013.01); *H03K 5/24* (2013.01); *H02M 1/0009* (2021.05); *H03K 2005/00071* (2013.01)

(58) Field of Classification Search
None
See application file for complete search history.

(56) References Cited

U.S. PATENT DOCUMENTS

| | | | |
|---|---|---|---|
| 5,144,525 A * | 9/1992 | Saxe ..................... | G11C 27/024 365/45 |
| 5,929,665 A | 7/1999 | Ichikawa et al. | |
| 6,798,161 B2 | 9/2004 | Suzuki | |
| 2016/0248412 A1 * | 8/2016 | Kadowaki ............... | H02M 1/38 |

(Continued)

FOREIGN PATENT DOCUMENTS

| | | |
|---|---|---|
| JP | H10-337046 A | 12/1998 |
| JP | 2003-324928 A | 11/2003 |
| JP | 2015-204659 A | 11/2015 |

*Primary Examiner* — Daniel C Puentes
(74) *Attorney, Agent, or Firm* — Rabin & Berdo, P.C.

(57) ABSTRACT

A power module, including a high-side switching element and a low-side switching element connected to form a half bridge circuit, a high-side drive circuit which drives the high-side switching element, a low-side drive circuit which drives the low-side switching element, and a high-side current detection circuit which detects a current of the high-side switching element. The high-side drive circuit includes a high-side variable delay circuit which adjusts, according to a value detected by the high-side current detection circuit, a length of a high-side delay time from a time when a signal is inputted to the high-side drive circuit to a time when the high-side switching element is driven.

10 Claims, 10 Drawing Sheets

(56) References Cited

U.S. PATENT DOCUMENTS

2017/0077821 A1\* 3/2017 Namekawa ....... H02M 3/33571
2017/0093392 A1 3/2017 Kobayashi et al.
2022/0085803 A1\* 3/2022 Jeon ..................... H03K 17/162

\* cited by examiner

POWER MODULE WITH BUILT-IN DRIVE CIRCUITS

CROSS-REFERENCE TO RELATED APPLICATION

This application is based upon and claims the benefit of priority of the prior Japanese Patent Application No. 2020-084784, filed on May 13, 2020, the entire contents of which are incorporated herein by reference.

BACKGROUND OF THE INVENTION

1. Field of the Invention

The embodiments discussed herein relate to a power module with built-in drive circuits.

2. Background of the Related Art

Intelligent power modules are used in motor drive inverters. Some intelligent power modules include a plurality of combinations of a half bridge circuit made up of two switching elements connected in series and a drive circuit which on-off drives the switching elements.

FIG. 7 is a circuit diagram illustrative of an example of the structure of the whole of an intelligent power module used in a three-phase motor drive inverter. FIG. 8 is a circuit diagram illustrative of an example of the structure of a circuit corresponding to one phase of the intelligent power module. FIG. 9 is a timing chart in which a switching time is prescribed. FIG. 10 illustrates the current-dependent characteristic of a high-side turn-off time.

An intelligent power module 100 illustrated in FIG. 7 is a power converter which supplies alternating power to a three-phase motor 200. Accordingly, the intelligent power module 100 includes three half bridge circuits for the U phase, the V phase, and the W phase. A U-phase half bridge circuit is made up of switching elements 101 and 102. A V-phase half bridge circuit is made up of switching elements 103 and 104. A W-phase half bridge circuit is made up of switching elements 105 and 106. A voltage-controlled insulated gate bipolar transistor (IGBT) and a free wheeling diode connected to collector and emitter terminals of the voltage-controlled insulated gate bipolar transistor in inverse parallel therewith are used as each of the switching elements 101 through 106. A voltage-controlled power metal-oxide-semiconductor field-effect transistor (MOSFET) may be used as each of the switching elements 101 through 106.

A collector terminal of the switching element 101 included in the high side of the U-phase half bridge circuit is connected via a P terminal of the intelligent power module 100 to a positive electrode terminal VDC(+) of a direct-current power source. A collector terminal of the switching element 103 included in the high side of the V-phase half bridge circuit is connected via the P terminal of the intelligent power module 100 to the positive electrode terminal VDC(+) of the direct-current power source. A collector terminal of the switching element 105 included in the high side of the W-phase half bridge circuit is connected via the P terminal of the intelligent power module 100 to the positive electrode terminal VDC(+) of the direct-current power source. Emitter terminals of the switching elements 101, 103, and 105 are connected via a U terminal, a V terminal, and a W terminal of the intelligent power module 100 to a U-phase terminal, a V-phase terminal, and a W-phase terminal, respectively, of the three-phase motor 200. Furthermore, the emitter terminals of the switching elements 101, 103, and 105 are connected to VS terminals of high-side drive circuit 111, 112, and 113 respectively. Gate terminals of the switching elements 101, 103, and 105 are connected to OUT terminals of high-side drive circuits 111, 112, and 113 respectively.

A collector terminal of the switching element 102 included in the low side of the U-phase half bridge circuit is connected to the emitter terminal of the high-side switching element 101. A collector terminal of the switching element 104 included in the low side of the V-phase half bridge circuit is connected to the emitter terminal of the high-side switching element 103. A collector terminal of the switching element 106 included in the low side of the W-phase half bridge circuit is connected to the emitter terminal of the high-side switching element 105. Emitter terminals of the switching elements 102, 104, and 106 are connected to an NU terminal, an NV terminal and an NW terminal, respectively, of the intelligent power module 100. The NU terminal, the NV terminal and the NW terminal are connected to one terminal of a current-detection shunt resistor 121. The other terminal of the shunt resistor 121 is connected to a negative electrode terminal VDC(−) of the direct-current power source. Gate terminals of the switching elements 102, 104, and 106 are connected to a UOUT terminal, a VOUT terminal, and a WOUT terminal, respectively, of a low-side drive circuit 114.

The high-side drive circuits 111, 112, and 113 has IN terminals connected to an IN(HU) terminal, an IN(HV) terminal, and an IN(HW) terminal, respectively, of the intelligent power module 100. The low-side drive circuit 114 has a UIN terminal, a VIN terminal, a WIN terminal, and an IS terminal connected to an IN(LU) terminal, an IN(LV) terminal, an IN(LW) terminal, and an IS terminal, respectively, of the intelligent power module 100.

Each of the high-side drive circuits 111, 112, and 113 and the low-side drive circuit 114 has a GND terminal connected to a COM terminal of the intelligent power module 100. The COM terminal of the intelligent power module 100 is connected to the other terminal of the shunt resistor 121. The IS terminal of the intelligent power module 100 is connected via a resistor 122 and a filter including a capacitor 123 and a protection diode 124 to the one terminal of the shunt resistor 121.

The IN(HU) terminal, IN(HV) terminal, IN(HW) terminal, IN(LU) terminal, IN(LV) terminal, and IN(LW) terminal of the intelligent power module 100 are connected to an upper controller (not illustrated) and receive control signals from the upper controller. When the intelligent power module 100 receives a control signal at the IN(HU) terminal, the IN(HV) terminal, or the IN(HW) terminal, the high-side drive circuit 111, 112, or 113 on-off drives the switching element 101, 103, or 105. When the intelligent power module 100 receives a control signal at the IN(LU) terminal, the IN(LV) terminal, or the IN(LW) terminal, the low-side drive circuit 114 on-off drives the switching element 102, 104, or 106. A current flowing through the low-side switching element 102, 104, or 106 is converted by the shunt resistor 121 to a voltage signal. The low-side drive circuit 114 receives the voltage signal and performs overcurrent protection and short-circuit protection.

Circuits corresponding to the U, V, and W phases of the intelligent power module 100 are equal in structure and function. Therefore, FIG. 8 illustrates the structure of the circuit corresponding to the U phase as a representative of them. The circuit corresponding to the U phase of the intelligent power module 100 includes the high-side drive circuit 111, the switching element 101, the low-side drive circuit 114, and the switching element 102.

The high-side drive circuit 111 includes a level shift circuit 131, a delay circuit 132, a driver circuit 133, and an output circuit 134. The output circuit 134 includes a p-channel MOSFET 135 and an n-channel MOSFET 136 connected in series. The level shift circuit 131 receives at the IN terminal a high-side input signal generated with a potential at the GND terminal as reference and level-shifts the input signal to a signal generated with a potential at the VS terminal as reference. The signal after the level shift is delayed for a determined time by the delay circuit 132 and is inputted to the driver circuit 133. The driver circuit 133 on-off drives the MOSFETs 135 and 136 of the output circuit 134 on the basis of the signal delayed by the delay circuit 132. The output circuit 134 generates a signal with a high-side control power source voltage VB as a gate drive voltage of the switching element 101 and outputs the signal from the OUT terminal.

The low-side drive circuit 114 includes a delay circuit 141, a driver circuit 142, and an output circuit 143. The output circuit 143 includes a p-channel MOSFET 144 and an n-channel MOSFET 145 connected in series. The delay circuit 141 receives a low-side input signal at the UIN terminal, delays the input signal for a determined time, and inputs a delayed signal to the driver circuit 142. The driver circuit 142 on-off drives the MOSFETs 144 and 145 of the output circuit 143 on the basis of the delayed signal. The output circuit 143 generates a signal with a low-side control power source voltage Vcc as a gate drive voltage of the switching element 102 and outputs the signal from the UOUT terminal.

The behavior of the switching elements 101 and 102 turned on or off by input signals which the intelligent power module 100 receives at the IN(HU) terminal and the IN(LU) terminal will now be described by reference to FIG. 9. FIG. 9 illustrates a voltage VIN(HU) at the IN(HU) terminal, a gate-emitter voltage VGE(HU) of the switching element 101, a collector current IC(HU) of the switching element 101, and a collector-emitter voltage VCE(HU) of the switching element 101 in order from the top. Furthermore, FIG. 9 illustrates a voltage VIN(LU) at the IN(LU) terminal, a gate-emitter voltage VGE(LU) of the switching element 102, a collector current IC(LU) of the switching element 102, and a collector-emitter voltage VCE(LU) of the switching element 102. In addition, FIG. 9 illustrates a state in which the high-side switching element 101 switches from a turn-on state to a turn-off state and in which the low-side switching element 102 switches from a turn-off state to a turn-on state.

A switching time at the time of input signals being inputted to the IN(HU) terminal and the IN(LU) terminal is the sum of delay times of the input signals, a gate discharge time of the switching element 101, and a gate charge time of the switching element 102. The delay times of the input signals are times from the time when the input signal is inputted to the time when a gate of the switching element 101 is driven and from the time when the input signal is inputted to the time when a gate of the switching element 102 is driven and depend on the time constants of the delay circuit 132 in the high-side drive circuit 111 and the delay circuit 141 in the low-side drive circuit 114. The gate discharge time or the gate charge time is a time taken to directly drive the gate of the switching element 101 or 102 and depends on, for example, operating resistance values of the MOSFETs 135 and 136 of the output circuit 134 or the MOSFETs 144 and 145 of the output circuit 143.

According to FIG. 9, a high-side turn-off time toff is a time form the time when an input signal which gives instructions to turn off the switching element 101 is inputted to the time when the collector current IC(HU) of the switching element 101 becomes zero. A delay time is a time from the time when the instructions to turn off the switching element 101 are given to the time when the p-channel MOSFET 135 of the output circuit 134 is turned off and the n-channel MOSFET 136 of the output circuit 134 is turned on. A gate discharge time is a time from the time when the n-channel MOSFET 136 is turned on and discharging a gate capacitance of the switching element 101 is begun to the time when the collector current IC(HU) really becomes zero.

An input signal which gives instructions to turn on the low-side switching element 102 is inputted a predetermined dead time tDEAD(IN) after the instructions to turn off the high-side switching element 101 are given.

A low-side turn-on time ton is a time form the time when an input signal which gives instructions to turn on the switching element 102 is inputted to the time when charging a gate capacitance of the switching element 102 is completed. A delay time is a time from the time when the instructions to turn on the switching element 102 are given to the time when the p-channel MOSFET 144 of the output circuit 143 is turned on and the n-channel MOSFET 145 of the output circuit 143 is turned off. A gate charge time is a time from the time when the p-channel MOSFET 144 is turned on and charging the gate capacitance of the switching element 102 is begun to the time when charging the gate capacitance of the switching element 102 is completed and charging a mirror capacitor is begun.

FIG. 9 illustrates a case where the high-side switching element 101 is turned off and where the low-side switching element 102 is turned on. However, the same applies to a case where the low-side switching element 102 is turned off and where the high-side switching element 101 is turned on. In this case, the symbols of the high-side VIN(HU), VGE(HU), IC(HU), and VCE(HU) are replaced with the symbols of the low-side VIN(LU), VGE(LU), IC(LU), and VCE(LU).

If the switching element 101 and the switching element 102 go into a turn-off state at the same time, then the U-phase half bridge circuit is short-circuited. In order to prevent this, the dead time tDEAD(IN) is set. The dead time tDEAD(IN) is designed with, for example, variations in the turn-off time toff of the switching element 101 and the turn-on time ton of the switching element 102 taken into consideration so as to satisfy a minimum dead time needed in specifications.

In order to ensure a dead time margin, the differential between the maximum value of variations in the high-side turn-off time toff and the minimum value of variations in the low-side turn-on time ton needs to satisfy a minimum dead time needed in specifications.

In order to satisfy a minimum dead time, a switching time is adjusted. Usually, a switching time is adjusted by adjusting a gate discharge time (see, for example, Japanese Laid-open Patent Publication No. 2015-204659).

According to Japanese Laid-open Patent Publication No. 2015-204659, for example, the following method is adopted when a drive circuit turns off an IGBT. First a gate capacitance is discharged at a high speed after a delay time. After that, a discharge speed is decreased by stages. By doing so, a gate discharge time is adjusted.

By the way, with voltage-controlled switching elements it is ascertained that a change in turn-off time toff depends on a collector current. FIG. 10 indicates that a turn-off time toff of an IGBT which is a high-side switching element depends on a collector current. According to FIG. 10, the turn-off time toff of the IGBT tends to increase in a low collector current area. For example, when the collector current is 75 amperes (A), the turn-off time toff is 3.8 microseconds (μs). However, when the collector current is 2 A, the turn-off time toff is 4.8 μs. This operation is caused by an IGBT chip. A depletion layer depends on drift layer concentration and it is difficult for a depletion layer to extend in a low collector current area. This is a phenomenon specific to voltage-controlled devices.

When this phenomenon occurs, a turn-off time becomes longer. As a result, it is difficult to ensure a desired dead time margin. To enhance the driving capability of a high-side drive circuit is known as an ordinary method for reducing a gate charge or discharge time. However, if the driving capability of a high-side drive circuit is enhanced, then the rate of a change in the collector current at the time of a switching element shutting off a large current becomes greater. As a result, a turn-off surge voltage which is a counter-electromotive voltage generated due to wiring inductance increases and may exceed a breakdown voltage. This leads to a dielectric breakdown.

SUMMARY OF THE INVENTION

According to an aspect, there is provided a power module including a high-side switching element and a low-side switching element connected to form a half bridge circuit; a high-side drive circuit which drives the high-side switching element; a low-side drive circuit which drives the low-side switching element; and a high-side current detection circuit which detects a current of the high-side switching element, wherein the high-side drive circuit includes a high-side variable delay circuit which adjusts, according to a value detected by the high-side current detection circuit, a length of a high-side delay time from a time when a signal is inputted to the high-side drive circuit to a time when the high-side switching element is driven.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
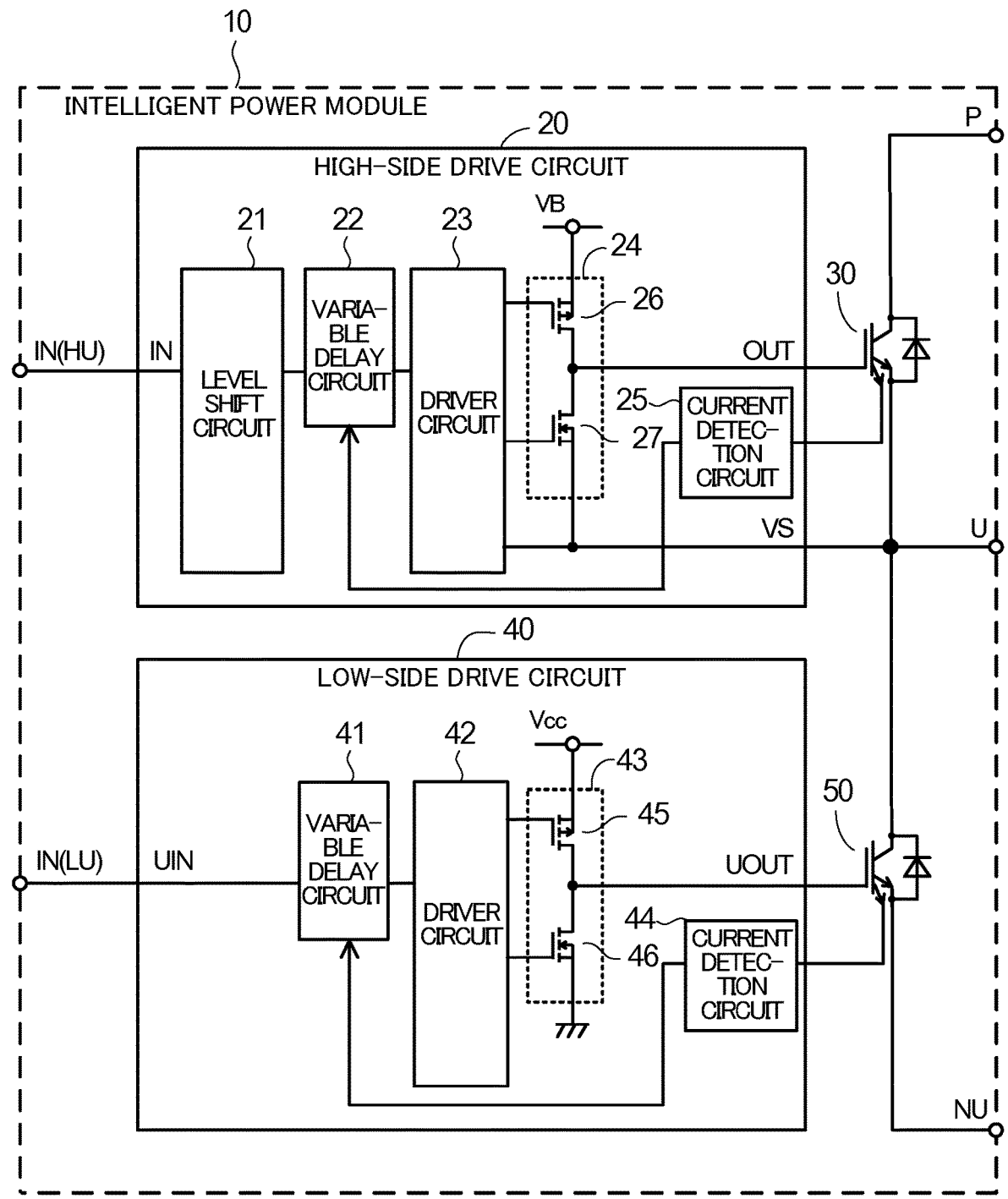
FIG. 1 is a circuit diagram illustrative of an example of the structure of an intelligent power module according to a first embodiment.

Embodiments will now be described in detail by referring to the drawings with a case where the present disclosure is applied to an intelligent power module used in a three-phase motor drive inverter as an example. In order to avoid the complexity of the drawings, only circuit structure corresponding to the U phase will be described. Components in the drawings indicated by the same numerals are the same. Furthermore, as long as inconsistency does not arise, a plurality of embodiments may partially be combined and implemented.

Figure 2:
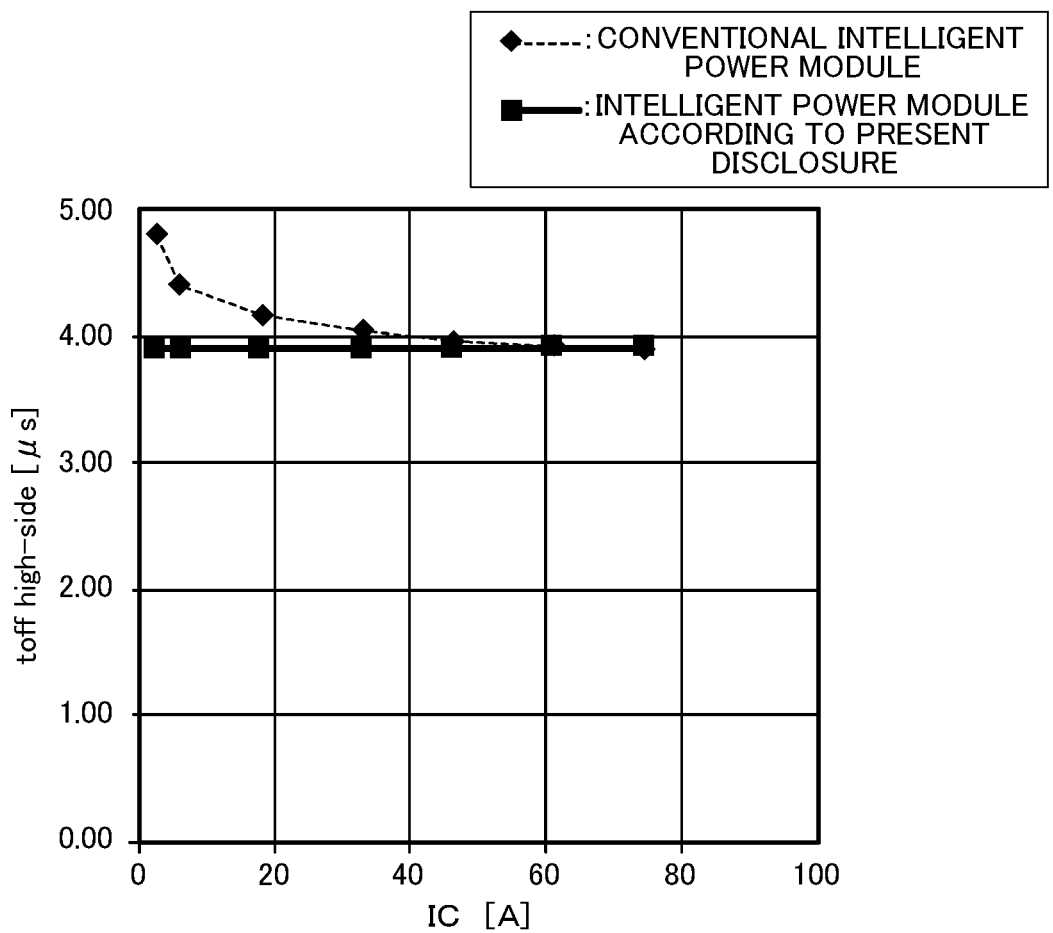
FIG. 2 illustrates the current-dependent characteristic of a high-side turn-off time.
Figure 3:
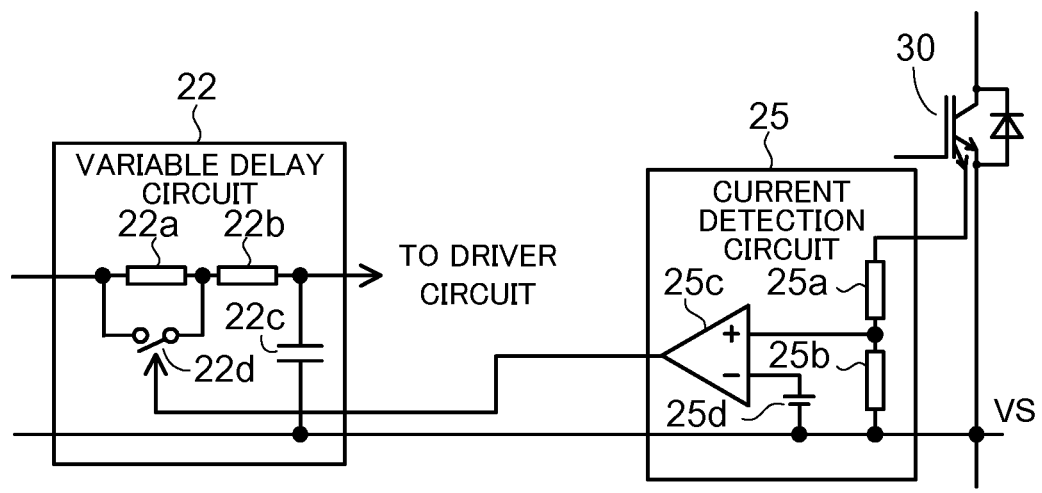
FIG. 3 is a circuit diagram illustrative of main components on the high side.
Figure 4:
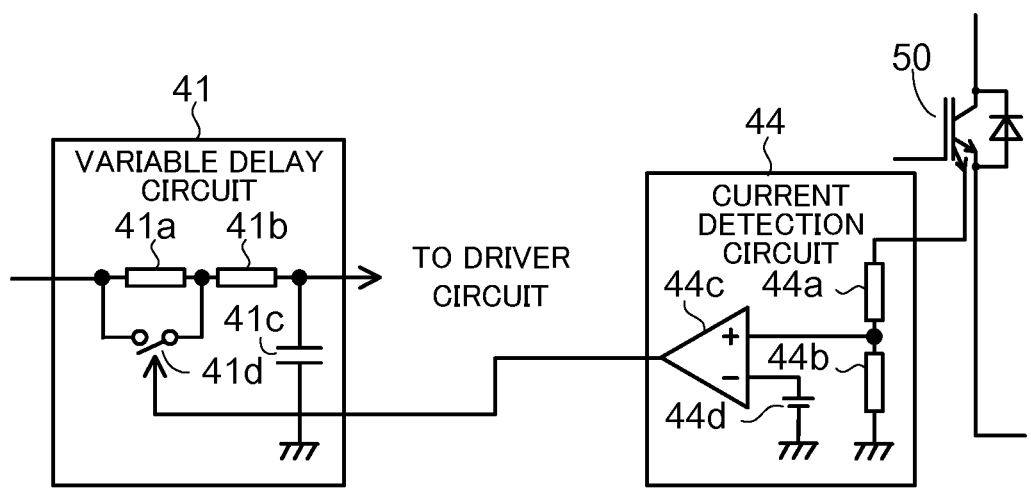
FIG. 4 is a circuit diagram illustrative of main components on the low side.

FIG. 1 is a circuit diagram illustrative of an example of the structure of an intelligent power module according to a first embodiment. FIG. 2 illustrates the current-dependent characteristic of a high-side turn-off time. FIG. 3 is a circuit diagram illustrative of main components on the high side. FIG. 4 is a circuit diagram illustrative of main components on the low side.

An intelligent power module 10 according to a first embodiment includes a high-side drive circuit 20, a switching element 30, a low-side drive circuit 40, and a switching element 50. Each of the switching elements 30 and 50 is an IGBT and a free wheeling diode connected in inverse parallel. An IGBT includes a main IGBT and a sense IGBT which is a current sense element for detecting a current flowing through the main IGBT.

The high-side drive circuit 20 includes a level shift circuit 21, a variable delay circuit 22, a driver circuit 23, an output circuit 24, and a current detection circuit 25. The output circuit 24 includes a p-channel MOSFET 26 and an n-channel MOSFET 27 connected in series.

The high-side drive circuit 20 has an IN terminal. The IN terminal is connected to an IN(HU) terminal of the intelligent power module 10 at which a high-side input signal is received and an input terminal of the level shift circuit 21. An output terminal of the level shift circuit 21 is connected to an input terminal of the variable delay circuit 22. An output terminal of the variable delay circuit 22 is connected to an input terminal of the driver circuit 23. The driver circuit 23 has first and second output terminals connected to the output circuit 24 and a high-side reference potential terminal connected to a VS terminal of the high-side drive circuit 20. The first output terminal of the driver circuit 23 is connected to a gate terminal of the p-channel MOSFET 26 and a source terminal of the MOSFET 26 is connected to a line of a high-side control power source voltage VB. The second output terminal of the driver circuit 23 is connected to a gate terminal of the n-channel MOSFET 27 and a source terminal of the MOSFET 27 is connected to the VS terminal of the high-side drive circuit 20. A drain terminal of the p-channel MOSFET 26 is connected to a drain terminal of the n-channel MOSFET 27 and an OUT terminal of the high-side drive circuit 20. The OUT terminal of the high-side drive circuit 20 is connected to a gate terminal of the switching element 30. A collector terminal of the switching element 30 is connected to a P terminal of the intelligent power module 10 to which a positive electrode terminal of an external direct-current power source is connected. An emitter terminal of the switching element 30 is connected to the VS terminal of the high-side drive circuit 20, a collector terminal of the low-side switching element 50, and a U terminal of the intelligent power module 10. A sense emitter terminal of the sense IGBT incorporated in the switching element 30 is connected to an input terminal of the current detection circuit 25. An output terminal of the current detection circuit 25 is connected to a control input terminal of the variable delay circuit 22. The current detection circuit 25 may be incorporated in the high-side drive circuit 20 or be located outside the high-side drive circuit 20.

The low-side drive circuit 40 includes a variable delay circuit 41, a driver circuit 42, an output circuit 43, and a current detection circuit 44. The output circuit 43 includes a p-channel MOSFET 45 and an n-channel MOSFET 46 connected in series.

The low-side drive circuit 40 has a UIN terminal. The UIN terminal is connected to an IN(LU) terminal of the intelligent power module 10 at which a low-side input signal is received and an input terminal of the variable delay circuit 41. An output terminal of the variable delay circuit 41 is connected to an input terminal of the driver circuit 42. The driver circuit 42 has first and second output terminals connected to the output circuit 43. The first output terminal of the driver circuit 42 is connected to a gate terminal of the p-channel MOSFET 45 and a source terminal of the MOSFET 45 is connected to a line of a low-side control power source voltage Vcc. The second output terminal of the driver circuit 42 is connected to a gate terminal of the n-channel MOSFET 46 and a source terminal of the MOSFET 46 is connected to a ground of the low-side drive circuit 40. A drain terminal of the p-channel MOSFET 45 is connected to a drain terminal of the n-channel MOSFET 46 and a UOUT terminal of the low-side drive circuit 40. The UOUT terminal of the low-side drive circuit 40 is connected to a gate terminal of the switching element 50. A collector terminal of the switching element 50 is connected to the U terminal of the intelligent power module 10. An emitter terminal of the switching element 50 is connected to an NU terminal of the intelligent power module 10 to which a negative electrode terminal of the external direct-current power source is connected. A sense emitter terminal of the switching element 50 is connected to an input terminal of the current detection circuit 44. An output terminal of the current detection circuit 44 is connected to a control input terminal of the variable delay circuit 41. The current detection circuit 44 may be incorporated in the low-side drive circuit 40 or be located outside the low-side drive circuit 40.

When the high-side drive circuit 20 of the intelligent power module 10 receives at the IN terminal an input signal for turning on the switching element 30, the level shift circuit 21 level-shifts a reference potential of the input signal from a ground potential to a potential at the VS terminal. A signal after the level shift is inputted to the variable delay circuit 22. The variable delay circuit 22 includes two delay circuits which differ in delay time, and has the function of performing switching between a delay time set by an existing delay circuit and a delay time shorter than that set by the existing delay circuit according to a value of a collector current of the switching element 30 detected by the current detection circuit 25. The current detection circuit 25 receives a current detection signal from the sense emitter terminal of the switching element 30 and determines whether or not the collector current is larger than a preset current value. For example, the preset current value is one tenth of the absolute maximum rating of a collector current.

A signal delayed by the variable delay circuit 22 is inputted to the driver circuit 23. The driver circuit 23 turns on the p-channel MOSFET 26 of the output circuit 24 and turns off the n-channel MOSFET 27 of the output circuit 24. By doing so, the driver circuit 23 turns on the switching element 30. As a result, a collector current of the switching element 30 increases. When the collector current exceeds the preset current value, the current detection circuit 25 switches the variable delay circuit 22 to a delay circuit which sets a shorter delay time.

When the high-side drive circuit 20 receives an input signal for turning off the switching element 30, the input signal is level-shifted by the level shift circuit 21 and is delayed in the variable delay circuit 22 by the delay circuit which sets the shorter delay time. A delay time set by the variable delay circuit 22 when the switching element 30 is turned off is made shorter in advance than a delay time set when the switching element 30 is turned on. Accordingly, an increase in the delay time, which is part of a high-side turn-off time, in a low collector current area is canceled. Accordingly, as illustrated in FIG. 2, the dependence of the high-side turn-off time on the collector current in the low collector current area is suppressed. As a result, a desired dead time margin is ensured.

Furthermore, with the low-side drive circuit 40 of the intelligent power module 10 a delay time of the variable delay circuit 41 is also switched when the switching element 50 is turned off. With the low-side drive circuit 40, the current detection circuit 44 receives a current detection signal from the sense emitter terminal of the switching element 50, detects a collector current of the switching element 50, and switches a delay time of the variable delay circuit 41 according to a value of the collector current. This is the same with the high-side drive circuit 20. As a result, a delay time of a turn-off time of the switching element 50 is also reduced on the low side. Accordingly, a desired dead time margin is ensured.

A concrete example of the structure of each of the variable delay circuit 22 and the current detection circuit 25 of the high-side drive circuit 20 and the variable delay circuit 41 and the current detection circuit 44 of the low-side drive circuit 40 will now be described.

On the high side, as illustrated in FIG. 3, the variable delay circuit 22 of the high-side drive circuit 20 includes two resistors 22a and 22b, a capacitor 22c, and a switch 22d. The input terminal of the variable delay circuit 22 is connected to one terminal of the resistor 22a and the other terminal of the resistor 22a is connected to one terminal of the resistor 22b. The other terminal of the resistor 22b is connected to one terminal of the capacitor 22c and the output terminal of the variable delay circuit 22. The other terminal of the capacitor 22c is connected to a line of the VS terminal which is a reference potential of the high-side drive circuit 20. Furthermore, the input terminal of the variable delay circuit 22 is connected to one terminal of the switch 22d. The other terminal of the switch 22d is connected to the common connection point of the resistors 22a and 22b and a control input terminal of the switch 22d is connected to the output terminal of the current detection circuit 25.

The current detection circuit 25 includes two resistors 25a and 25b, a comparator 25c, and a reference voltage source 25d. The input terminal of the current detection circuit 25 to which the sense emitter terminal of the switching element 30 is connected is connected to one terminal of the resistor 25a and the other terminal of the resistor 25a is connected to one terminal of the resistor 25b. The other terminal of the resistor 25b is connected to the line of the VS terminal. The common connection point of the resistors 25a and 25b is connected to a non-inverting input terminal of the comparator 25c and an inverting input terminal of the comparator 25c is connected to a positive electrode terminal of the reference voltage source 25d. A negative electrode terminal of the reference voltage source 25d is connected to the line of the VS terminal. An output terminal of the comparator 25c is the output terminal of the current detection circuit 25 and is connected to the control input terminal of the switch 22d of the variable delay circuit 22. The reference voltage source 25d outputs a voltage corresponding to a preset collector current value which the current detection circuit 25 is to detect.

The resistors 22a and 22b and the capacitor 22c of the variable delay circuit 22 make up an RC circuit. The variable delay circuit 22 has two time constants depending on whether or not the resister 22a is short-circuited by the switch 22d. That is to say, when the switch 22d is open (in a non-conducting state), a time constant is indicated by the product of the sum of the resistance values of the resistors 22a and 22b and the capacitance value of the capacitor 22c. This time constant is equal to that of the existing delay circuit and a delay time is also equal to that set by the existing delay circuit. When the switch 22d is closed (in a conducting state), a time constant is indicated by the product of the resistance value of the resistor 22b and the capacitance value of the capacitor 22c. This time constant is smaller than that of the existing delay circuit and a delay time is shorter than that set by the existing delay circuit.

The current detection circuit 25 receives from the sense emitter terminal of the switching element 30 a current detection signal proportional to a collector current of the switching element 30. When the current detection signal is supplied to the resistors 25a and 25b connected in series, the current detection signal is converted by the resistor 25b to a voltage signal. This voltage signal is applied to the non-inverting input terminal of the comparator 25c.

The comparator 25c compares the voltage signal corresponding to the current detection signal and the voltage of the reference voltage source 25d. When the collector current is small, for example, when the switching element 30 is turned off, the comparator 25c outputs a low-level output signal. As a result, the switch 22d in the variable delay circuit 22 becomes open. Accordingly, the time constant of the variable delay circuit 22 is large and a long delay time is set by the variable delay circuit 22.

When the switching element 30 is turned on and the collector current increases and exceeds a current corresponding to the voltage of the reference voltage source 25d, the comparator 25c outputs a high-level output signal. By doing so, the switch 22d in the variable delay circuit 22 gets closed. Accordingly, the time constant of the variable delay circuit 22 is small and a short delay time is set by the variable delay circuit 22. When the switching element 30 is turned off next, the collector current decreases. An increase in delay time in a low collector current area is canceled by a reduction in the delay time set by the variable delay circuit 22. A total high-side turn-off time including a gate discharge time does not lengthen. As a result, a desired dead time margin is ensured.

On the low side, as illustrated in FIG. 4, the variable delay circuit 41 of the low-side drive circuit 40 includes two resistors 41a and 41b, a capacitor 41c, and a switch 41d. The structure of the variable delay circuit 41 of the low-side drive circuit 40 is the same as that of the variable delay circuit 22 of the high-side drive circuit 20. However, the other terminal of the capacitor 41c is connected to the ground.

The structure of the current detection circuit 44 is the same as that of the current detection circuit 25 of the high-side drive circuit 20. The current detection circuit 44 includes two resistors 44a and 44b, a comparator 44c, and a reference voltage source 44d. However, the other terminal of the resistor 44b and a negative electrode terminal of the reference voltage source 44d are connected to the ground.

The current detection circuit 44 receives from the sense emitter terminal of the switching element 50 a current detection signal proportional to a collector current of the switching element 50. When the current detection signal is supplied to the resistors 44a and 44b connected in series, the current detection signal is converted by the resistor 44b to a voltage signal. This voltage signal is applied to the non-inverting input terminal of the comparator 44c.

The comparator 44c compares the voltage signal corresponding to the current detection signal and the voltage of the reference voltage source 44d. When the collector current is small, for example, when the switching element 50 is turned off, the comparator 44c outputs a low-level output signal. As a result, the switch 41d in the variable delay circuit 41 becomes open. Accordingly, the time constant of the variable delay circuit 41 is large and a long delay time is set by the variable delay circuit 41.

When the switching element 50 is turned on and the collector current increases and exceeds a current corresponding to the voltage of the reference voltage source 44d, the comparator 44c outputs a high-level output signal. By doing so, the switch 41d in the variable delay circuit 41 gets closed. Accordingly, the time constant of the variable delay circuit 41 is small and a short delay time is set by the variable delay circuit 41. When the switching element 50 is turned off next, the short delay time is set by the variable delay circuit 41. As a result, a total low-side turn-off time including a gate discharge time does not lengthen. Accordingly, the low-side turn-off time does not exceed the minimum dead time margin.

Figure 5:
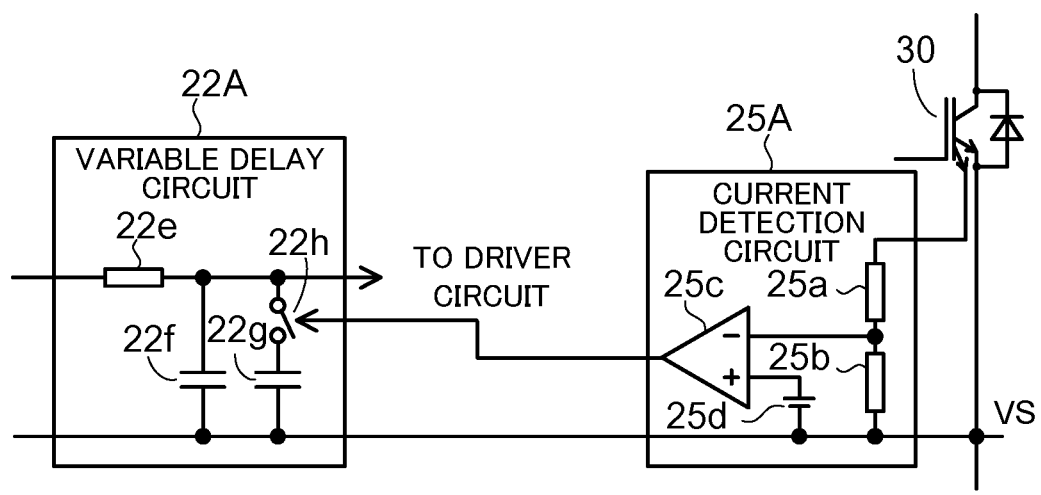
FIG. 5 is a circuit diagram illustrative of main components on the high side of an intelligent power module according to a second embodiment.
Figure 6:
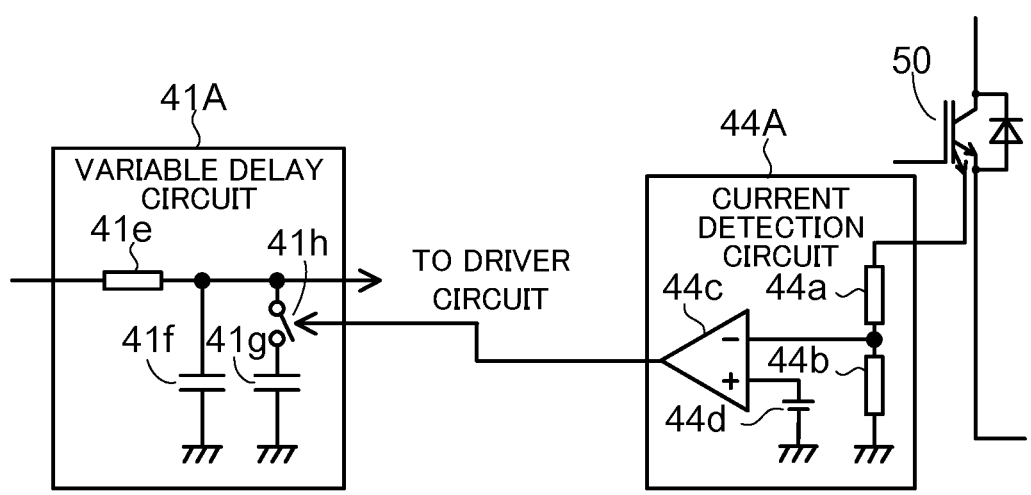
FIG. 6 is a circuit diagram illustrative of main components on the low side of the intelligent power module according to the second embodiment.
Figure 7:
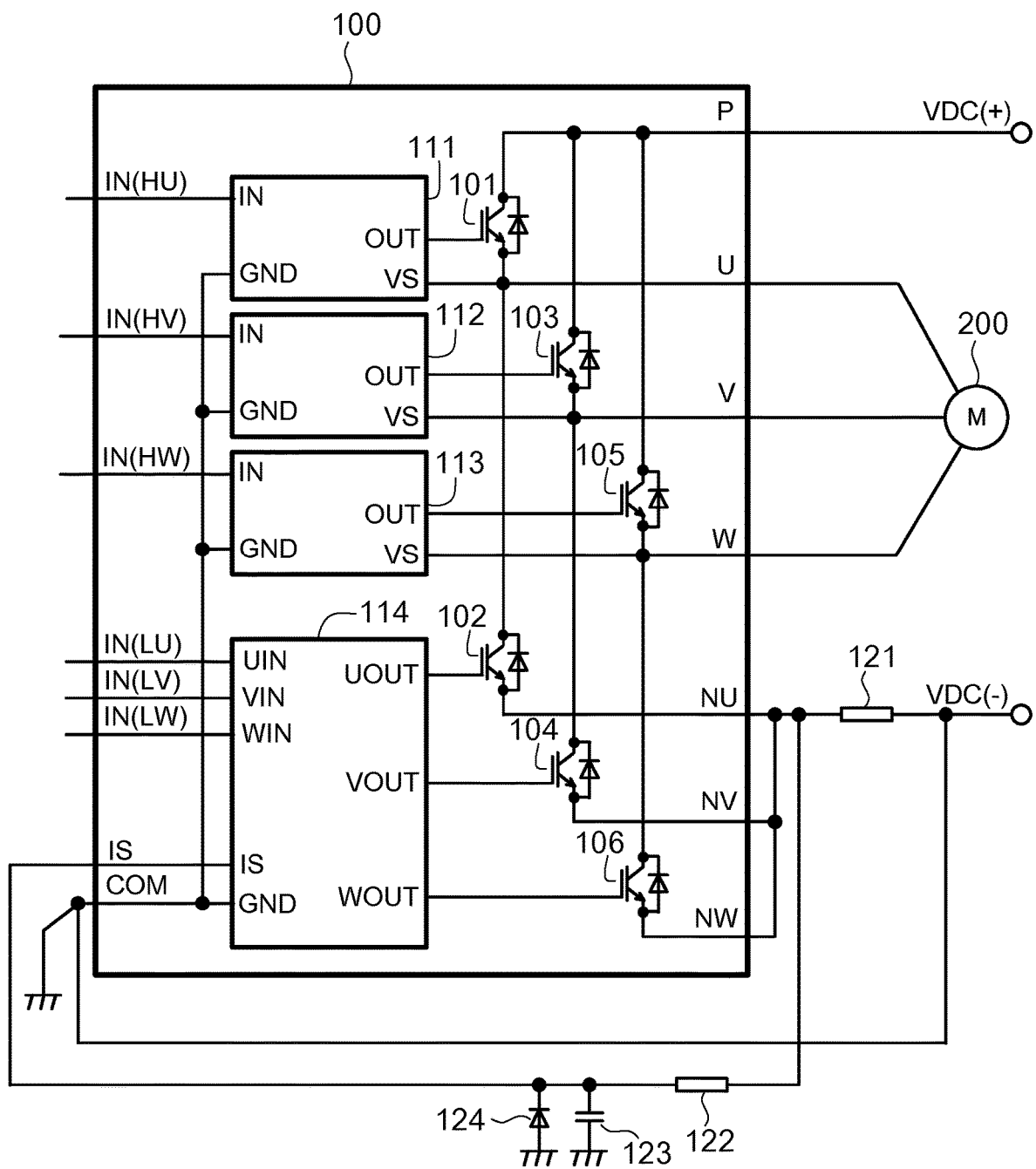
FIG. 7 is a circuit diagram illustrative of an example of the structure of the whole of an intelligent power module used in a three-phase motor drive inverter.
Figure 8:
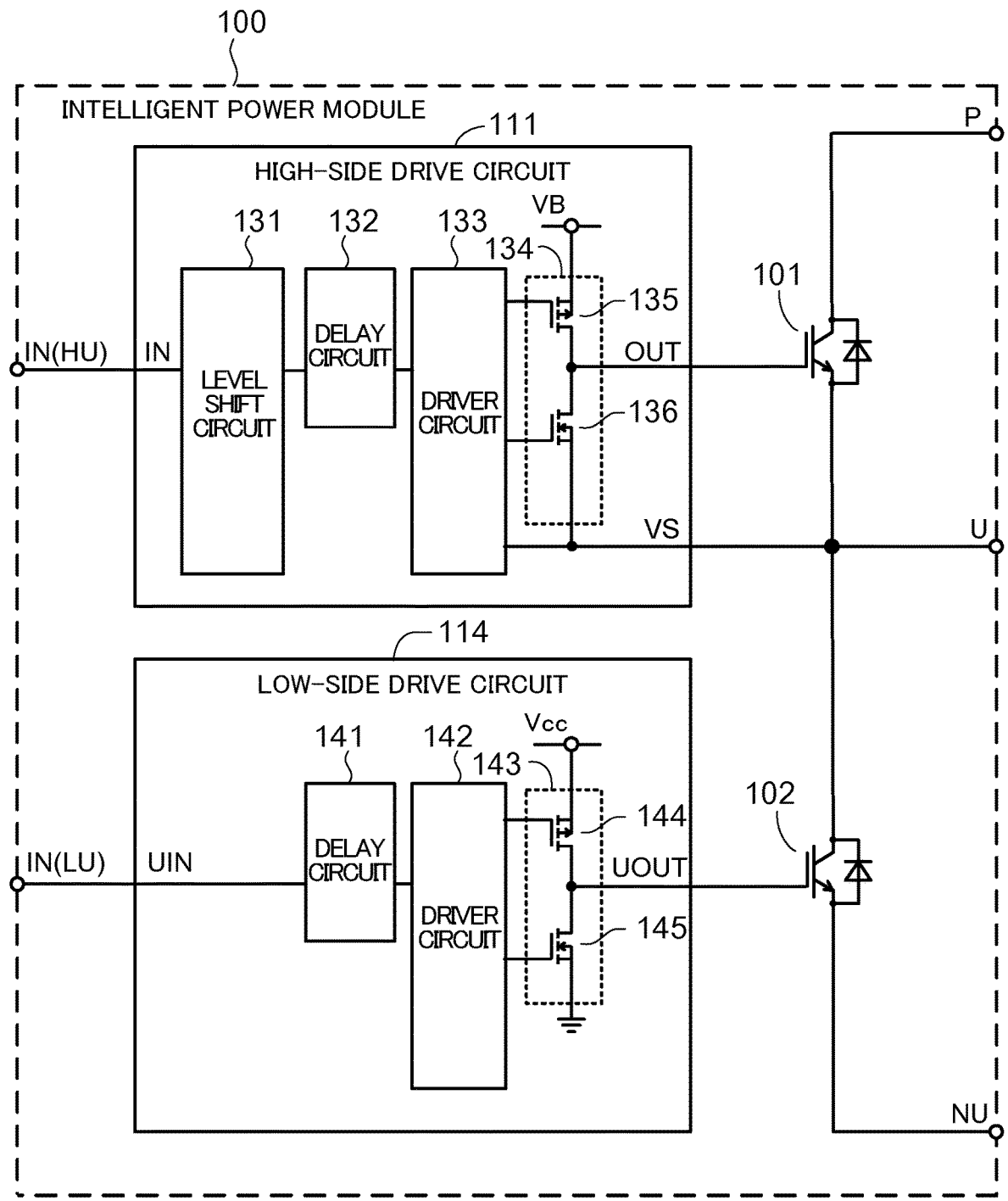
FIG. 8 is a circuit diagram illustrative of an example of the structure of a circuit corresponding to one phase of the intelligent power module.
Figure 9:
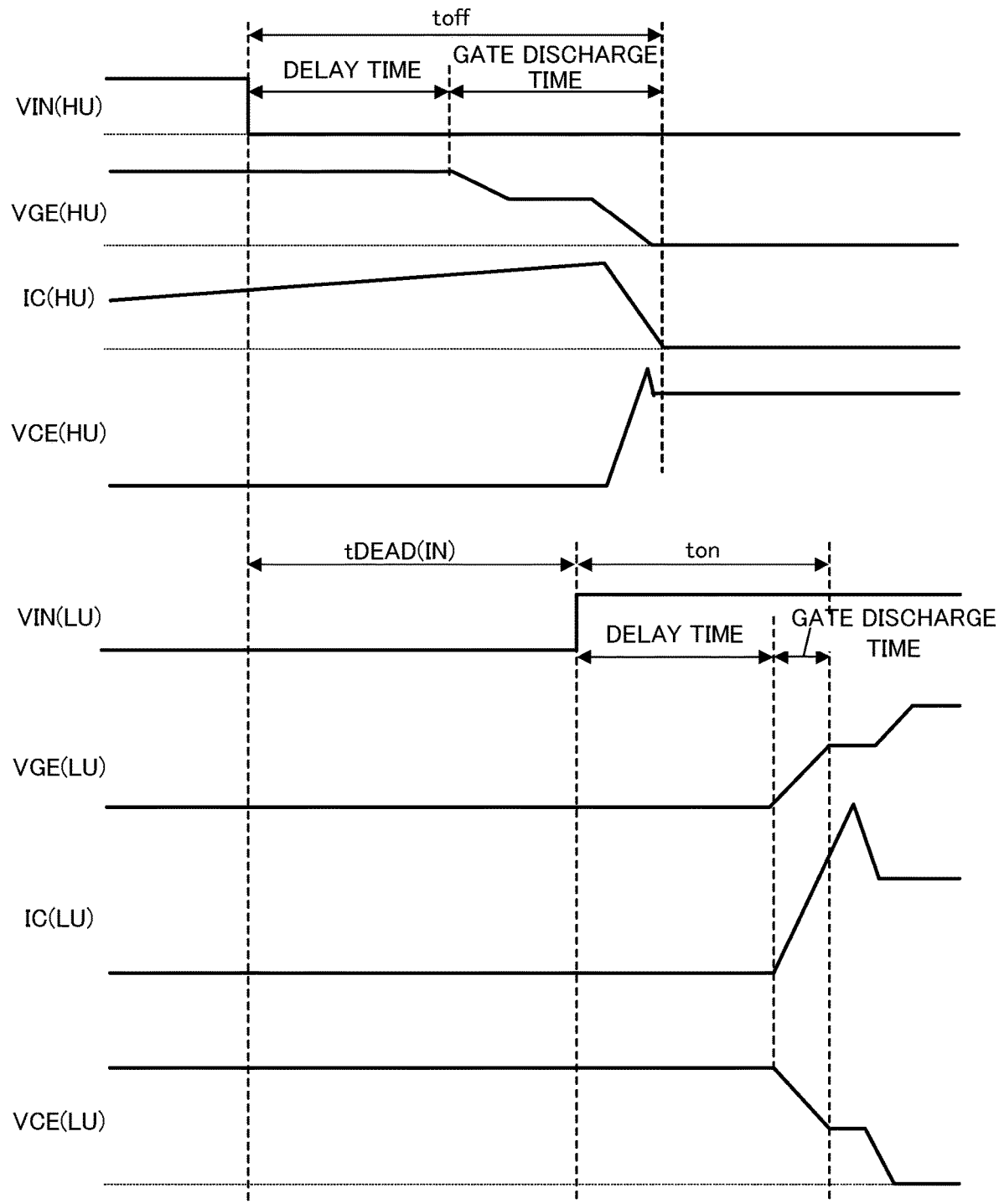
FIG. 9 is a timing chart in which a switching time is prescribed.
Figure 10:
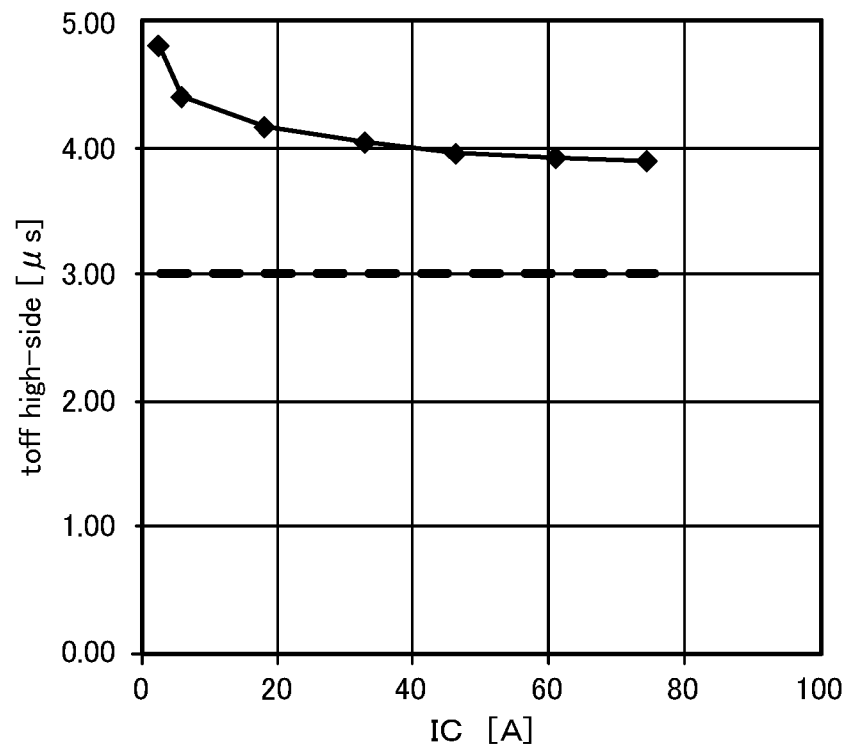
FIG. 10 illustrates the current-dependent characteristic of a high-side turn-off time.

FIG. 5 is a circuit diagram illustrative of main components on the high side of an intelligent power module according to a second embodiment. FIG. 6 is a circuit diagram illustrative of main components on the low side of the intelligent power module according to the second embodiment.

As illustrated in FIG. 5, a high-side drive circuit 20 in a second embodiment includes a variable delay circuit 22A and a current detection circuit 25A. The variable delay circuit 22A includes a resistor 22e, two capacitors 22f and 22g, and a switch 22h. An input terminal of the variable delay circuit 22A is connected to one terminal of the resistor 22e. The other terminal of the resistor 22e is connected to one terminal of the capacitor 22f, one terminal of the switch 22h, and an output terminal of the variable delay circuit 22A. The other terminal of the switch 22h is connected to one terminal of the capacitor 22g. The other terminal of the capacitor 22f and the other terminal of the capacitor 22g are connected to a line of a VS terminal which is a reference potential of the high-side drive circuit 20. A control input terminal of the switch 22h is connected to an output terminal of the current detection circuit 25A.

The current detection circuit 25A includes two resistors 25a and 25b, a comparator 25c, and a reference voltage source 25d. This is the same with the current detection circuit 25 in the first embodiment and the structure of the current detection circuit 25A is the same as that of the current detection circuit 25 in the first embodiment. However, connections to an inverting input terminal and a non-inverting input terminal of the comparator 25c are reverse to the connections to the inverting input terminal and the non-inverting input terminal of the comparator 25c of the current detection circuit 25 in the first embodiment.

According to the variable delay circuit 22A and the current detection circuit 25A, when a collector current is small, for example, when a switching element 30 is turned off, the current detection circuit 25A outputs a high-level output signal. As a result, the switch 22h in the variable delay circuit 22A gets closed and the capacitance value of an RC circuit becomes larger. Accordingly, the time constant of the variable delay circuit 22A is large and a long delay time is set by the variable delay circuit 22A.

When the switching element 30 is turned on and the collector current increases and exceeds a current corresponding to the voltage of the reference voltage source 25d, the comparator 25c outputs a low-level output signal. By doing so, the switch 22h in the variable delay circuit 22A becomes open. Accordingly, the time constant of the variable delay circuit 22A is small and a short delay time is set by the variable delay circuit 22A. When the switching element 30 is turned off next, the short delay time is set by the variable delay circuit 22A. As a result, a total high-side turn-off time including a gate discharge time is shortened.

As illustrated in FIG. 6, a low-side drive circuit 40 in the second embodiment includes a variable delay circuit 41A and a current detection circuit 44A. The variable delay circuit 41A includes a resistor 41e, two capacitors 41f and 41g, and a switch 41h. The structure of the variable delay circuit 41A is the same as that of the high-side variable delay circuit 22A.

The current detection circuit 44A includes two resistors 44a and 44b, a comparator 44c, and a reference voltage source 44d. The structure of the current detection circuit 44A is the same as that of the high-side current detection circuit 25A.

According to the variable delay circuit 41A and the current detection circuit 44A, when a collector current is small, for example, when a switching element 50 is turned off, the current detection circuit 44A outputs a high-level output signal. As a result, the switch 41h in the variable delay circuit 41A gets closed and the capacitance value of an RC circuit becomes larger. Accordingly, the time constant of the variable delay circuit 41A is large and a long delay time is set by the variable delay circuit 41A.

When the switching element 50 is turned on and the collector current increases and exceeds a current corresponding to the voltage of the reference voltage source 44d, the comparator 44c outputs a low-level output signal. By doing so, the switch 41h in the variable delay circuit 41A becomes open. Accordingly, the time constant of the variable delay circuit 41A is small and a short delay time is set by the variable delay circuit 41A. When the switching element 50 is turned off next, the short delay time is set by the variable delay circuit 41A. As a result, a total low-side turn-off time including a gate discharge time is shortened.

Each switching element in the above embodiments has the current-dependent characteristic of a turn-off time in a low collector current area. That is to say, a turn-off time becomes longer in a low collector current area. However, the same applies to an intelligent power module using switching elements having the current-dependent characteristic of a turn-off time in a large collector current area. That is to say, a turn-off time becomes longer in a large collector current area. In this case, only connections to an inverting input terminal and a non-inverting input terminal of a comparator in a current detection circuit are reversed.

With the power module with the built-in drive circuits having the above structure, a switching time of a switching element is adjusted by a delay time. Accordingly, an increase in turn-off time at turn-off time in a low collector current area is canceled by an adjusted delay time and a dead time margin is ensured.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A power module, comprising:
   a high-side switching element and a low-side switching element connected to form a half bridge circuit;
   a high-side drive circuit which drives the high-side switching element; and
   a low-side drive circuit which drives the low-side switching element, wherein the high-side drive circuit includes
      a high-side current detection circuit which detects a current of the high-side switching element, and
      a high-side variable delay circuit which adjusts, according to a value of the current detected by the high-side current detection circuit, a length of a high-side delay time from a time when a signal is inputted to the high-side drive circuit to a time when the high-side switching element is driven, by setting a delay time that is shorter when the high-side switching element is turned off than when the high-side switching element is turned on, wherein
   the high-side current detection circuit causes the high-side variable delay circuit to adjust the length of the high-side delay time, in accordance with whether or not the value of the current detected by the high-side current detection circuit exceeds a preset current value when the high-side switching element is turned on.

2. The power module according to claim 1, wherein the high-side variable delay circuit includes a resistor and a capacitor, and adjusts the length of the high-side delay time by changing a resistance value of the resistor to thereby change a time constant.

3. The power module according to claim 1, wherein the high-side variable delay circuit includes a resistor and a capacitor and adjusts the length of the high-side delay time by changing a capacitance value of the capacitor to thereby change a time constant.

4. The power module according to claim 1, wherein when the high-side current detection circuit determines that the detected value of the current flowing through the high-side switching element exceeds the preset current value, the high-side variable delay circuit reduces the high-side delay time.

5. The power module according to claim 1, wherein:
   the high-side switching element includes a current sense element; and the high-side current detection circuit detects a current value outputted by the current sense element as the detected value of the current flowing through the high-side switching element.

6. The power module according to claim 1, wherein each of the high-side switching element and the low-side switching element is a voltage-controlled device.

7. The power module according to claim 6, wherein each of the voltage-controlled devices is an insulated gate bipolar transistor (IGBT) or a power metal-oxide-semiconductor field-effect transistor (MOSFET).

8. The power module according to claim 1, further comprising a low-side current detection circuit which detects a current of the low-side switching element, wherein the low-side drive circuit includes a low-side variable delay circuit which adjusts, according to a value detected by the low-side current detection circuit, a length of a low-side delay time from a time when a signal is inputted to the low-side drive circuit to a time when the low-side switching element is driven.

9. The power module according to claim 1, wherein the high-side variable delay circuit sets a first high-side delay time to a first delay time when the value of the current does not exceed the preset current value, the first high-side delay time being a part of a high-side turn-on time of the high-side switching element, and sets a second high-side delay time to a second delay time when the value of the current exceeds the preset current value, the second high-side delay time being a part of a high-side turn-off time of the high-side switching element and the second delay time being shorter than the first delay time.

10. A power module, comprising:

a high-side switching element and a low-side switching element connected to form a half bridge circuit;

a high-side drive circuit which drives the high-side switching element; and a low-side drive circuit which drives the low-side switching element, wherein the high-side drive circuit includes a high-side current detection circuit which detects a current of the high-side switching element, and a high-side variable delay circuit which adjusts, according to a value of the current detected by the high-side current detection circuit, a length of a high-side delay time from a time when a signal is inputted to the high-side drive circuit to a time when the high-side switching element is driven;

the high-side variable delay circuit sets a first high-side delay time to a first delay time when the value of the current does not exceed a preset current value, the first high-side delay time being a part of a high-side turn-on time of the high-side switching element, and sets a second high-side delay time to a second delay time when the value of the current exceeds the preset current value, the second high-side delay time being a part of a high-side turn-off time of the high-side switching element and the second delay time being shorter than the first delay time; and the high-side current detection circuit causes the high-side variable delay circuit to adjust the length of the high-side delay time, in accordance with whether or not the value of the current detected by the high-side current detection circuit exceeds the preset current value when the high-side switching element is turned on.

* * * * *